United States Patent [19]

Rzeszewski

[11] 4,097,812
[45] Jun. 27, 1978

[54] FREQUENCY SELECTIVE DETECTOR CIRCUIT

[75] Inventor: Theodore S. Rzeszewski, Lombard, Ill.

[73] Assignee: Matsushita Electric Corporation, Franklin Park, Ill.

[21] Appl. No.: 818,651

[22] Filed: Jul. 25, 1977

[51] Int. Cl.² ............................................. H03K 9/06
[52] U.S. Cl. ............................... 328/138; 307/233 R; 328/140; 329/107
[58] Field of Search ....................... 329/104, 107, 126; 328/138, 140; 307/233 R, 234, 295

[56] References Cited

U.S. PATENT DOCUMENTS

| 3,976,948 | 8/1976 | Dearden et al. | 328/138 |
|---|---|---|---|
| 4,024,414 | 5/1977 | Gurry | 307/233 R |
| 4,047,114 | 9/1977 | Lane et al. | 329/126 X |

Primary Examiner—Siegfried H. Grimm
Attorney, Agent, or Firm—Weiss & Ptak

[57] ABSTRACT

A frequency selective detector circuit is useful as a high/low pass detector or as a bandpass detector. The high/low pass detector comprises a pair of digital missing pulse detector circuits or resettable one-shot multivibrators that are connected together in cascade between a source of input pulses and the detector circuit output. The timing interval of the first missing pulse detector circuit in the cascade is less than the timing interval of the second missing pulse detector circuit in the cascade. By combining two such circuits to supply their outputs to a coincidence gate, a bandpass detector circuit results.

7 Claims, 7 Drawing Figures

FREQUENCY SELECTIVE DETECTOR CIRCUIT

RELATED APPLICATION

This application is related to application Ser. No. 720,898, filed Sept. 7, 1976, now abandoned.

BACKGROUND OF THE INVENTION

In the fields of television receiver remote control systems, telephone signalling and mobile communications, there is a need for frequency selective circuits which can distinguish between input signal frequencies in narrow bands or with precise frequency cutoffs. Often these bands are adjacent one another, such as in the various mobile communication bands and in the different frequencies used for remote control signals in a television receiver to effect different operations of the receiver in response to the control signals of different frequencies.

Generally, the detector circuits for providing the narrow-band responses are precisely tuned analog circuits, the tuning of which cannot easily be changed once it has been established initially. In addition, there usually is a dead region between the different frequency bands where neither adjacent detector gives an indication of a frequency, or a problem of cross-talk from one detector region into another is present. It has been difficult to identify a single frequency in a specific frequency range (or band) with such analog filters because of tuning inaccuracies.

In addition to the foregoing disadvantages of analog circuits, a primary disadvantage exists in the implementation of such circuits into integrated circuit form. At the present state of the art, when most of the circuit is implemented in integrated circuit form, the time-out determining components must be discrete, off-chip components. This is wasteful of bonding pads and requires additional manufacturing assembly steps.

Furthermore, analog circuits requiring storage capacitors, tuning coils and the like, are difficult to precisely adjust to consistent manufacturing tolerances so that each circuit has the same time-out period. As a consequence, it often is necessary to provide some type of adjustment for such circuits when they are manufactured. In addition, even with the provision of an adjustment, typically in the form of an adjustable potentiometer, it is difficult to maintain precision operation of such analog timing circuits over extended time periods due to changes resulting from component aging, even if expensive precision components are used. Some digital circuit approaches to narrow-band filters or detectors have been attempted, but the known digital systems are relatively complex and exhibit difficulty in precisely defining the upper edge of one frequency band as the lower edge of the next adjacent frequency band without cross-talk problems between signals which are close to this dividing line.

As a consequence, it is desirable to have a digital, frequency selective, detector circuit or band-pass detector circuit which is free of the disadvantages of analog circuits and which is capable of precise definition of the frequency band of its operation without cross-talk problems.

SUMMARY OF THE INVENTION

Accordingly, it is an object of this invention to provide an improved frequency selective detector circuit.

It is another object of this invention to provide an improved bandpass frequency selective detector circuit.

It is an additional object of this invention to provide an improved digital frequency selective circuit.

It is a further object of this invention to provide a digital bandpass frequency selective detector circuit.

It is yet another object of this invention to provide a digital bandpass frequency selective detector circuit using cascaded digital missing pulse detectors.

In a preferred embodiment of this invention, a frequency selective detector circuit includes first and second missing pulse detectors connected in cascade between a signal input terminal and an output terminal of the circuit. The first missing pulse detector circuit, which receives the signals applied to the input terminal, has a timing interval which is substantially shorter than the timing interval of the second missing pulse detector circuit connected in cascade with it. The circuit then operates to detect or distinguish between input square-wave signals which have periods less than twice the timing interval of the first missing pulse detector from those input square-wave signals which have a timing period longer than twice the timing interval of the first missing pulse detector.

DETAILED DESCRIPTION

In the different figures of the drawings, the same reference numbers are used to designate the same or similar components. Also, reference is made to a "digital counter" and this term is intended to encompass all types of counting circuits which are advanced in response to clock pulses to attain different counts indicative of the number of clock pulses applied to them. Such counters, for example, may be clocked memories in the form of ring-type counter circuits, shift registers, or binary digital counters.

Figure 1:
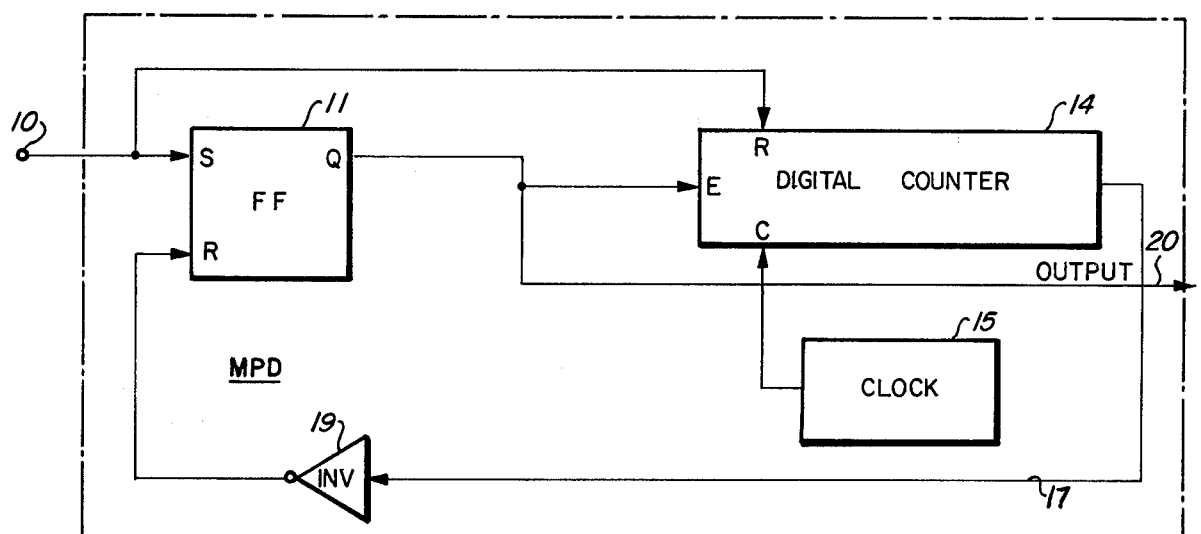
FIG. 1 is a circuit diagram of a typical missing pulse detector circuit which may be used in the system according to the invention.

Referring now to FIG. 1 of the drawing, there is shown a digital circuit interconnected to operate as a "missing pulse" detector. Another name which may be used for such a circuit is "retriggerable multivibrator." Whether the circuit is called a missing pulse detector or a retriggerable multivibrator, the circuit functions to provide a first output signal condition on its output terminal 20 whenever pulses applied to an input terminal 10 occur at some repetition rate which is greater than the time constant of the circuit. If the pulses applied to the input terminal 10 occur at a repetition rate which is less than the time constant of the circuit, a different output signal condition appears on the terminal 20.

Input pulses, or square wave signals, supplied to the input terminal 10 are applied to the "set" input of a digital type "D" flip-flop 11, which is set to a first stable condition by the negative-going pulse transition of any of the pulses appearing on the input terminal 10, if the flip-flop 11 already has not been set to such a condition. In this condition, the "Q" output of the flip-flop 11 goes to its "high" stable state. Whenever this output is "high," the enable input of a digital counter 14 is high and permits the counter 14 to respond to the clock pulses applied to it from a free-running clock multivibrator 15. These clock pulses are at a substantially higher frequency than the frequency of any pulses applied to the input terminal 10. The digital counter 14 may be any of a number of different types of digital counters, such as a TTL 74161 synchronous counter. Other types of available digital pulse counters, however, can also be used for the counter 14.

In the circuit of FIG. 1, the input terminal 10 also is connected to a "clear" input of the digital counter 14. Anytime a negative-going pulse transition appears on the terminal 10, the digital counter 14 is cleared or reset to its initial or zero count. Thereafter, so long as a positive or "high" input is applied to the "clear" input of the counter 14, the counter continues to advance its count in response to the pulse transitions in the output waveform from the clock circuit 15.

Figure 3:
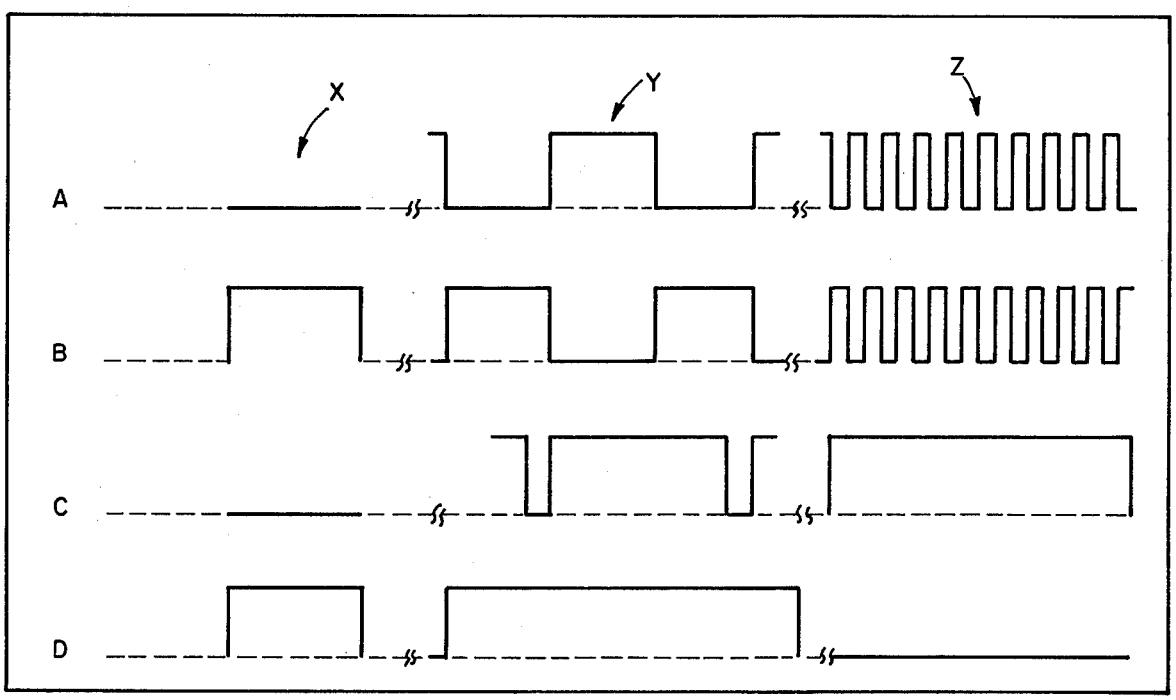
FIGS. 3 and 4 illustrate pulse waveforms useful in explaining the operation of the circuit shown in FIG. 2.

Assume now that an input waveform, such as illustrated in row B of FIG. 3 in the center section Y of that figure, is applied to the terminal 10 of the missing pulse detector circuit of FIG. 1. The first negative-going transition in waveform B on the terminal 10 sets the flip-flop 11 to its "high" state as shown in the waveform C of FIG. 3. This pulse also clears or resets the digital counter 14 to its zero count. Assume also that the time interval between the negative-going transitions in the waveform B of the signal applied on the terminal 10 is greater than the time interval required for the digital counter 14 to reach a maximum or preestablished count which produces a positive output pulse on an output lead 17 from the counter 14. When such a positive or "high" output pulse is obtained on the lead 17 (normally, at a "low" potential) in response to this maximum or other preestablished count, the pulse is inverted by an inverter circuit 19 to produce a negative-going pulse transition, which in turn is applied to the reset input (R) of the flip-flop 11. Whenever this negative pulse is applied to the reset input of the flip-flop 11, it is reset to a second stable condition, in which the "Q" output goes low. This in turn disables the digital counter 14 from counting further, so long as this second stable condition of the flip-flop 11 exists. However, as illustrated in waveforms B and C of FIG. 3, the next negative-going input pulse transition appearing on the input terminal 10 produces a positive output from the flip-flop 11 and also is applied to the "clear" input of the counter 14 to reset the counter back to its initial or zero count; and the circuit commences a new cycle of operation.

Assume now that the input pulses occur at a higher frequency such as shown in section Z of waveform B of FIG. 3. The first negative-going transition in this waveform sets the flip-flop 11 as shown in waveform C, section Z of FIG. 3. As stated previously, this pulse also clears and resets the digital counter 14; and so long as the time interval between the pulses applied to the input terminal 10 is less than the time interval required for the digital counter 14 to reach a maximum or preestablished count, the digital counter continues to be reset and it does not produce a positive output pulse on the lead 17. This is the operation which is depicted in section Z of FIG. 3 and it can be seen from waveform C that the output of the flip-flop 11 on terminal 20 remains high throughout the occurrence of these higher frequency input pulses on the terminal 10. In other words, the circuit of FIG. 1 remains in its unstable state, so long as the time interval between the termination of the negative portion of one of the pulses in the waveform B and the inception of the next negative-going transition is less than the time required for the digital counter 14 to count from its zero count to the preestablished count for producing the "high" output pulse on the lead 17.

The circuit of FIG. 1 accomplishes the foregoing results entirely with available digital circuit logic, and none of the time constants of the system requires analog storage devices or other analog circuitry. As a consequence, when the system is implemented in integrated circuit form, no bonding pads need to be wasted to permit connections to external circuit components, such as a timing capacitor and resistor. This permits additional circuit functions to be included on the integrated circuit chips and also eliminates the extra cost of the analog capacitor and resistor components, as well as eliminating the cost of assembling such components into a circuit. Another advantage to the circuit is that the time constant of the circuit can be readily varied by well known techniques. For example, instead of clearing the digital counter 14 to a zero or minimum count, it can be reset to some other established count to change the length of time or number of pulses required to be counted by the digital counter 14 before it produces an output pulse on the lead 17. Another way of changing the time interval of the circuit is to apply clock pulses to the digital counter 14 at different rates, that is, by changing the frequency of the pulses applied by the clock pulse generator 15.

Figure 2:
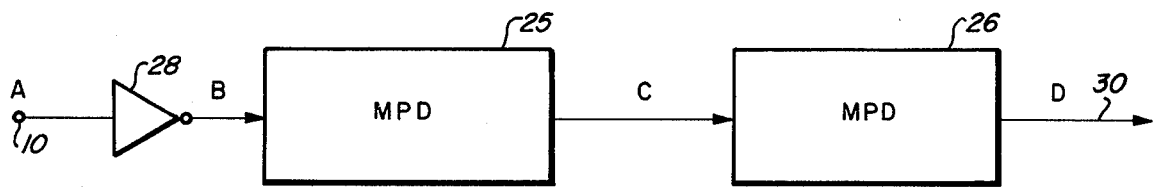
FIG. 2 is a circuit diagram of a preferred embodiment of the invention.

Referring now to FIG. 2, the basic building block circuit shown in FIG. 1 can be used to create a frequency selective detector circuit by connecting two missing pulse detectors of the type shown in FIG. 1 in series or cascade between an input terminal and an output terminal. In FIG. 2, first and second missing pulse detectors 25 and 26 are shown connected in series between an inverter 28 and an output terminal 30. Each of the missing pulse detectors 25 and 26 are of the type illustrated in FIG. 1, but the time constant or time-out internal ($\Delta t$) of the missing pulse detector 25 is less than the time-out interval of the missing pulse detector 26. It has been found in typical applications that a time interval for the missing pulse detector 26 which is twice as long as that of the missing pulse detector 25 is generally sufficient, although the time interval of the circuit 26 can be an order of magnitude longer than the time interval of the circuit 25.

The operation of the circuit of FIG. 2 now should be considered in conjunction with the waveforms shown in FIG. 3. First of all, in section X of FIG. 3, the status of the system operation when no input signals are applied to the input terminal 10 is illustrated. The letters A, B, C and D in FIG. 2 are used to identify the points in which the correspondingly lettered waveforms of FIG. 3 appear. When no input signals are applied to terminal A, it is in a "low" potential state. This state is inverted by the inverter 28 as shown in waveform B to a "high" signal state which results in the steady state, "low" output on the output terminal (c) of the missing pulse detector 25. This low state applied to the input of the missing pulse detector 26 holds the missing pulse detector 26 in its "high" output state as shown in waveform D of section X of FIG. 3.

Now assume that a square-wave input signal having a period longer than twice the timing interval of the first missing pulse detector 25 is applied to the input terminal 10. This is shown in section Y, waveform A. Waveform B shows this inverted waveform and waveform C illustrates the output of the missing pulse detector 25 in response to this square wave signal. The negative-going portions of the waveform C result when the time-out period of the missing pulse detector 25 is reached, causing it to reset prior to the next negative-going transition in the waveform B applied to its input. These negative-going transitions of the output of the missing pulse detector 25 are applied to the input of the missing pulse detector 26 to continuously reset that missing pulse detector, resulting in the steady state "high" output shown in waveform D of section Y of FIG. 3.

Now assume that the square-wave signal input applied to the terminal 10 has a frequency which is such that its period is less than twice the timing interval of the missing pulse detector 25. This signal condition is illustrated in section Z of FIG. 3, which shows that this higher frequency signal applied to the input of the missing pulse detector 25 causes the output of the missing pulse detector 25 (waveform C) to rise to a steady "high" condition. This in turn results in the steady state output of the missing pulse detector 26 to drop to a steady "low" output condition as illustrated in waveform D, section Z of FIG. 3.

Figure 4:
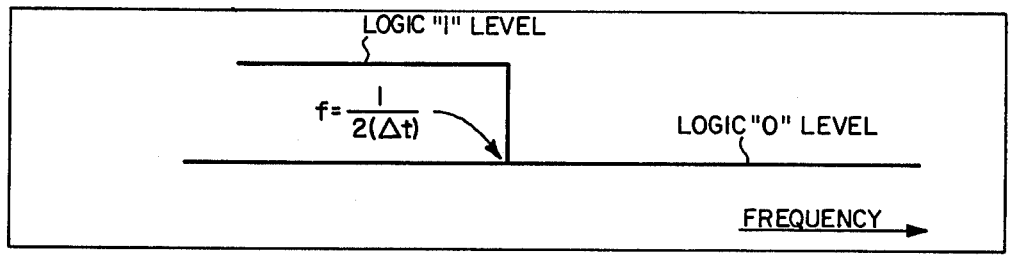

The cutoff level between the "high" or logic "1" output level and the "low" or logic "0" output level on output 30, as illustrated at waveform D, occurs at a frequency of input signals $f = (1/2\Delta t)$, where $\Delta t$ is the time delay period of the missing pulse detector 25. This is illustrated in FIG. 4. This sharp distinction between input frequencies below this frequency, and input frequencies above this frequency, as exemplified by the output of the circuit has the property that it acts as a frequency discriminator (or a high-pass or low-pass detector) for detecting input square waves that have a period longer than twice the timing interval ($\Delta t$) of the first missing pulse detector 25 in the cascade circuit.

Figure 5:
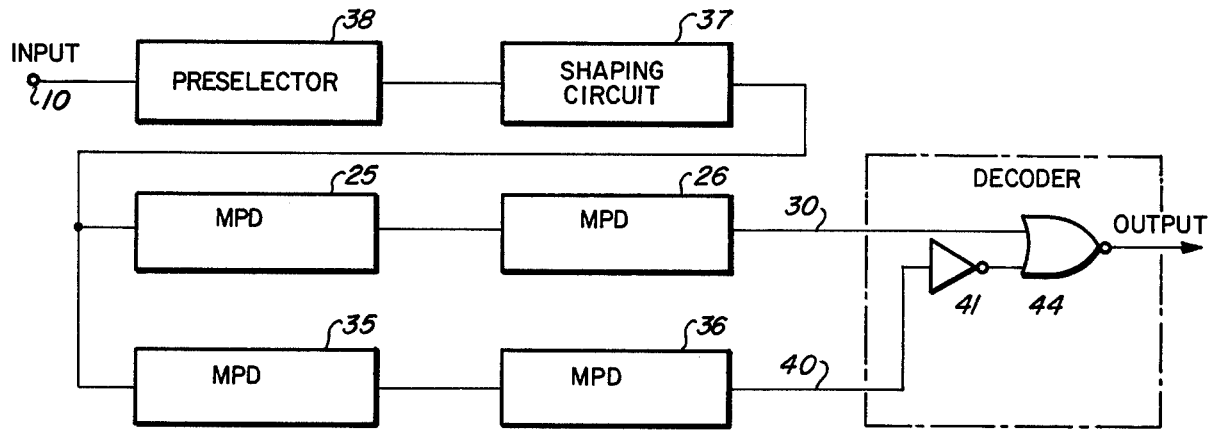
FIGS. 5 and 6 show additional embodiments of the invention.

The principle which has been illustrated in conjunction with FIG. 2 can be expanded to cause the circuit to operate as a band-pass detector for a sine wave or square wave input. Such a circuit is illustrated in FIG. 5, which shows the missing pulse detectors 25 and 26 of FIG. 2 used as a portion of the circuit to which have been added another pair of cascaded missing pulse detectors 35 and 36. The inputs to both of the missing pulse detectors 25 and 35 are connected together to the output of a wave shaping circuit 37, which in turn is supplied with input signals from an input terminal 10 through a preselector circuit 38.

The input signals applied on the terminal 10 may be from any suitable source and typically are sine wave tone signals, for example, of the type used in remote control signalling for television receivers. The preselector 38 is used to reject low frequency signals which possibly could cause the second missing pulse detectors 26 and 36 to follow the low frequency signal input to the circuit. Since the low frequency signals normally are not utilized in the system and would result only from unwanted low frequency noise or the like, the rejection provided by the preselector circuit 38 assures that the outputs 30 and 40 of the missing pulse detectors 26 and 36 are stable steady-state "high" or "low" outputs.

If sine wave input signals are applied to the input terminal 10, the shaping circuit 37 is necessary to reshape these signals into a square wave signal waveform useful in the operation of the system. The square wave input signals then are applied in parallel to both of the missing pulse detectors 25 and 35. The time delays ($\Delta t$) of the missing pulse detectors 25 and 35 are different, and typically the time delay of the missing pulse detector 25 is greater than the time delay of the missing pulse detector 35 to bracket the time period of the square wave signal frequencies which are to be detected by the narrow band detector of the circuit of FIG. 5. As stated previously, the time delays of both of the missing pulse detectors 26 and 36 are selected to be greater than the time delays of the detectors 25 and 35 and typically may be an order of magnitude greater than those signals. When this occurs, the output signals on the outputs 30 and 40 both are either "high" or "low" depending upon the operation of the input missing pulse detectors 25 and 35 and follow the same waveform patterns which have been illustrated in FIG. 3 and described previously in conjunction with a single leg of the circuit illustrated in FIG. 2. By inverting the output of the missing pulse detector 36 through an inverter 41 and supplying this inverted output along with the normal output of the missing pulse detector 26 to the two inputs of a NOR gate 44, comprising a decoder circuit, the output of the NOR gate 44 then corresponds to a narrow band digital logic signal as illustrated in output A of FIG. 7 whenever the input signal frequencies lie between a pair of frequencies $f_1$ and $f_2$. The frequencies $f_1$ and $f_2$ in turn are dependent upon the time delays ($\Delta t$) of the missing pulse detectors 25 and 35 respectively, in accordance with the following formulae:

$$f_1 = 1/2 \, \Delta t_{25} \quad \text{and} \quad f_2 = 1/2 \, \Delta t_{35}$$

The purpose of the preselector 38 is just to pass the general range of frequencies of interest in the operation of the system. The inherent selectivity of the transmission channel to which the input signals appearing on the terminal 10 are applied may be a sufficient preselector of itself in such applications as a television remote control receiver obtaining an input from an ultrasonic transducer. If this is the case, a separate preselector circuit 38 is not required. Whether a separate preselector circuit 38 is used or not, the selectivity of the system should be such that the timing periods of the missing pulse detectors 26 and 36 should be made longer than the period of the lowest frequency input applied to the shaping circuit 37.

The circuit of FIG. 5 can be adjusted to a frequency range as desired, and it even may be shifted to different frequency bands quite easily by either adjusting the number loaded into the digital counter 14 (FIG. 1) in each of the missing pulse detector circuits 25 and 35, or by adjusting the clock frequency of the clock pulses applied to the counter in these missing pulse detectors. By adjusting either of these parameters, the timing interval of the circuit and the band-width, as well as its placement in the total frequency spectrum can be adjusted. By adjusting the timing interval ($\Delta t$) of the missing pulse detector 25, the lower frequency edge of the detection band is set, and by adjusting the timing interval ($\Delta t$) of the missing pulse detector 35, the upper edge of the detection band is selected. These frequency cut-off points are precise and have no cross-talk from frequencies that are near but are not within the cutoff ranges illustrated. This is a distinct advantage in the utilization of the circuit of FIG. 5 as a narrow-band detector as opposed to other approaches utilizing analog selectivity followed by a conventional envelope or synchronous detector because they do not completely reject tones that are near the cutoff frequencies. As a consequence, no guard bands need to be used when a number of circuits of the type of FIG. 5 are cascaded together.

Figure 7:
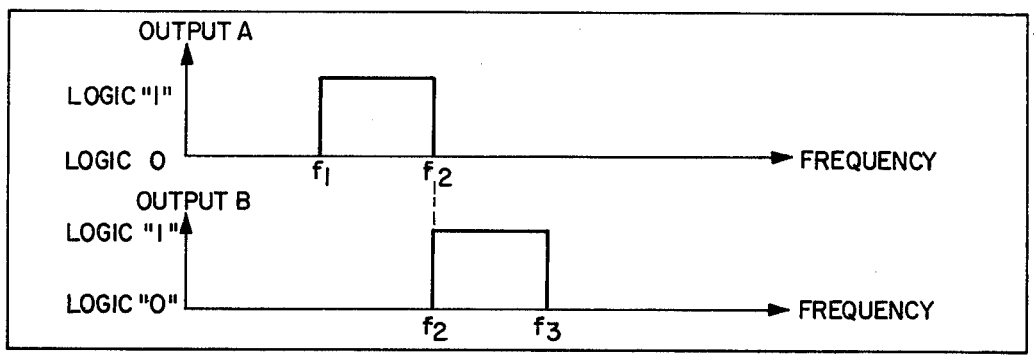
FIG. 7 illustrates pulse waveforms useful in explaining the operation of the circuits shown in FIGS. 5 and 6.

In contrast, however, if a conventional detector is used with analog filters, the filters must provide all the selectivity. Since these analog filters have a passband, a stop band, and a transition region connecting the two bands, the passband must be made wide enough to allow for tolerances on the desired frequency. However, the next passband cannot be made directly adjacent to the first one in frequency because the adjacent tone would be in the transition region for each filter and would not be attenuated sufficiently to insure that the detector would not respond incorrectly to the adjacent tone frequency. With the detector of FIG. 5, the preselector only needs to select out the range of frequencies of interest; and the precise frequency discrimination is done by the remainder of the frequency detector so accurately that a tone just slightly lower in frequency than $f_1$ is detected as logic "0" and one just higher in frequency than $f_1$ is detected as logic "1" with no transition region. Consequently, the bandwidth of the detector $(f_2-f_1)$ need only be wide enough to allow for the frequency tolerance of the incoming tone and the clock that provides the basic timing of the MPD as illustrated in FIG. 1. Also, the adjacent frequency region for a second tone detector can be made directly adjacent to the first as illustrated in FIG. 7. The region of output A is from $f_1$ to $f_2$, and the region from output B is from $f_2$ to $f_3$.

Figure 6:
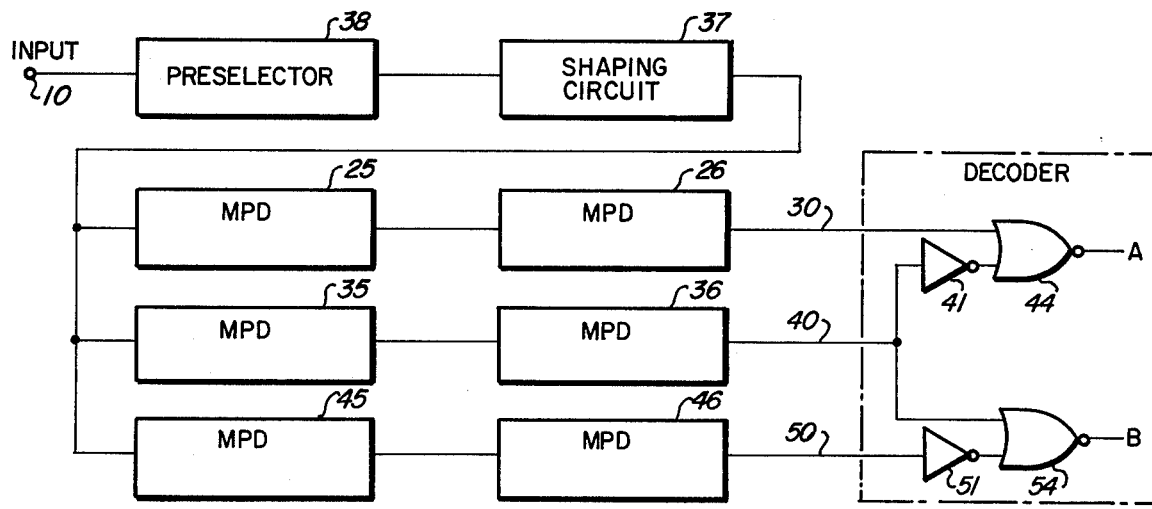

In FIG. 6 the utilization of the circuit techniques for providing a number of narrow band selective detectors without any guard bands between them is illustrated. The circuit of FIG. 6 is the same as the circuit of FIG. 5 except that two additional cascaded missing pulse detectors 45 and 46 have been added to the circuit. The missing pulse detector 45 is adjusted to have a response band or upper cutoff frequency at frequency $f_3 = 1/2 \Delta t_{45}$. Thus, the band of frequencies selected by gating together the outputs of the missing pulse detectors 36 and 46 is a band of frequencies $f_2$ and $f_3$ as illustrated in output B of FIG. 7. These signals are applied to an inverter/NOR gate circuit 51, 54 which operates in the same manner as the circuit 41, 44 described above in conjunction with FIG. 5. Additional cascaded missing pulse detector circuits can be added depending upon the number of different frequency selection bands which are utilized in any particular application. The circuit of FIG. 6 does not require guard bands whatsoever between adjacent frequencies. This means that the upper cutoff frequency for one narrow-band selective detector can constitute precisely the lower cutoff frequency for the next higher frequency band. This is illustrated in outputs A and B of FIG. 7.

In a circuit which has been constructed for utilization as a television remote control receiver, the frequency $f_1$ was 35.7 kilohertz and the frequency $f_2$ was 38.5 kilohertz. The additional frequencies or additional bands can then be made at 2.8 kilohertz increments until the desired number of outputs are provided. In the same system, the clock signals applied to the counters for the missing pulse detectors 25 and 35 were approximately 1 megahertz, whereas the clock signals applied to the counters of the missing pulse detectors 26 and 36 were 1/16 megahertz. These frequencies, however, are merely given as illustrative and are not to be considered limiting.

The rise time of the detector circuits which are illustrated in FIGS. 2, 5 and 6 is less than one period of the input signal and the fall time of the signal (that is, the time for switching at the output of the missing pulse detectors 26, 36 or 46) is a function of the preselectivity and the tuning interval of the second missing pulse detectors 26, 36 and 46 in the cascaded circuits.

It has been found that the response time of this technique is much quicker than the response time provided by analog narrow-band filters and conventional detectors, and the system may be easily programmed by multiplex techniques to change the count or the frequency of the clock signals to permit easy adjustments of the width of the frequency band detected by individual portions of the circuits and to locate the selected bands within the desired frequency spectrum. All of the circuits may be incorporated into integrated circuit chips, either independently as a detection system, or as part of a larger system incorporating frequency selective detection.

The preferred embodiments have been described in conjunction with the specific circuitry illustrated in the drawings and described above, but those skilled in the art may develop different equivalent circuits or systems practicing the invention and coming within the scope of the following claims.

I claim:

1. A frequency selective detector system including in combination:

first means having an input and an output for measuring an interval between pulses applied to the input thereof and providing a first output state on the output thereof when the interval between such input pulses is less than a first predetermined amount and providing a second output state on the output thereof whenever the interval between such input pulses is more than said first predetermined amount;

second means having an input connected to the output of said first means for measuring an interval between input pulses applied thereto and responsive to the output state of said first means to provide a first output state on the output thereof whenever the interval between successive attainments of the second output state of said first means is less than a second predetermined amount and providing a second output state whenever the time interval between successive attainments of the second output state of said first means is more than said second predetermined amount; and means for supplying input pulses to the input of said first means.

2. A frequency selective detector circuit including in combination:

a first digital missing pulse detector circuit with an input terminal and an output terminal and having a first predetermined timing interval;

a second digital missing pulse detector circuit having an input terminal and an output terminal, the input terminal of said second missing pulse detector circuit being connected with the output terminal of said first missing pulse detector circuit, said second missing pulse detector circuit having a second predetermined timing interval greater than said first predetermined timing interval; and means for supplying input pulses to the input of said first missing pulse detector circuit.

3. The combination according to claim 2 further including third and fourth missing pulse detector circuits each having an input terminal and an output terminal;

means connecting the input terminal of said third missing pulse detector circuit in common with the input terminal of said first missing pulse detector circuit, said third missing pulse detector circuit having a third predetermined timing interval different from said first predetermined timing interval of said first missing pulse detector circuit; and the input terminal of said fourth missing pulse detector circuit being connected with the output terminal of said third missing pulse detector circuit, said fourth missing pulse detector circuit having a fourth predetermined time interval greater than said third predetermined time interval; and coincidence gate means connected to the outputs of said second and fourth missing pulse detector circuit for producing the output of the frequency selective detector circuit.

4. The combination according to claim 3 wherein said coincidence gating means comprises a coincidence gate circuit and an inverter, and the output of one of said second and fourth missing pulse detector circuits is applied directly to said coincidence gate circuit and the output of the other of said second and fourth missing pulse detector circuits is applied through said inverter to said coincidence gate circuit.

5. The combination according to claim 3 wherein the timing interval of said third missing pulse detector circuit is less than the timing interval of said first missing pulse detector circuit.

6. The combination according to claim 5 wherein the timing intervals of said second and fourth missing pulse detector circuits are substantially greater than the timing intervals of said first and third missing pulse detector circuits.

7. The combination according to claim 6 wherein the timing intervals of said second and fourth missing pulse detector circuits are equal.

* * * * *